(12) United States Patent
Omoumi et al.

(10) Patent No.: US 11,290,074 B1
(45) Date of Patent: Mar. 29, 2022

(54) METHOD AND DEVICE FOR POWER SIGNAL GENERATION UTILIZING A FULLY-DIFFERENTIAL POWER AMPLIFIER

(71) Applicant: Technology for Energy Corporation, Knoxville, TN (US)

(72) Inventors: Kevin Christopher Omoumi, Cookeville, TN (US); Allen Vaughn Blalock, Louisville, TN (US)

(73) Assignee: Technology for Energy Corporation, Knoxville, TN (US)

( * ) Notice: Subject to any disclaimer, the term of this patent is extended or adjusted under 35 U.S.C. 154(b) by 53 days.

(21) Appl. No.: 16/148,962

(22) Filed: Oct. 1, 2018

Related U.S. Application Data

(60) Provisional application No. 62/565,796, filed on Sep. 29, 2017.

(51) Int. Cl.
| | | |
|---|---|---|
| *H03F 3/45* | (2006.01) | |
| *H03F 3/21* | (2006.01) | |
| *H03F 1/02* | (2006.01) | |

(52) U.S. Cl.
CPC .......... *H03F 3/45475* (2013.01); *H03F 1/02* (2013.01); *H03F 3/21* (2013.01); *H03F 3/45* (2013.01); *H03F 2200/129* (2013.01); *H03F 2203/45116* (2013.01)

(58) Field of Classification Search
CPC .......... H03F 3/45475; H03F 3/21; H03F 1/02; H03F 2200/129; H03F 2203/45116

USPC ..................................... 330/252–261, 69, 84
See application file for complete search history.

(56) References Cited

U.S. PATENT DOCUMENTS

| | | | |
|---|---|---|---|
| 6,914,479 B1* | 7/2005 | Gabillard | H03F 3/45278 330/252 |
| 7,538,618 B2* | 5/2009 | Park | H03F 1/3211 330/253 |
| 7,898,333 B2* | 3/2011 | Griffith | H03F 1/083 330/260 |
| 2015/0162879 A1* | 6/2015 | Xu | H03F 1/26 330/260 |

* cited by examiner

*Primary Examiner* — Khanh V Nguyen
*Assistant Examiner* — Khiem D Nguyen
(74) *Attorney, Agent, or Firm* — Pitts & Lake, P.C.

(57) ABSTRACT

The present general inventive concept is directed to a method and system to generate a power signal, including summing a non-inverted reference signal and an inverted feedback signal to output a non-inverted first summation signal, summing an inverted reference signal and a non-inverted feedback signal to output an inverted second summation signal, receiving the first summation signal at a non-inverted input of a differential power output driver, and the second summation signal at an inverted input of the differential power output driver, outputting a non-inverted power signal to a first terminal of an impedance load from a non-inverted output of the differential power output driver, and outputting an inverted power signal to a second terminal of the load from an inverted output of the differential power output driver, the non-inverted power signal also being used as the non-inverted feedback signal, and the inverted power signal also being used as the inverted feedback signal.

35 Claims, 5 Drawing Sheets

METHOD AND DEVICE FOR POWER SIGNAL GENERATION UTILIZING A FULLY-DIFFERENTIAL POWER AMPLIFIER

CROSS-REFERENCE TO RELATED APPLICATIONS

This application claims the benefit of U.S. Provisional Patent Application Ser. No. 62/565,796, filed on Sep. 29, 2017, the contents of which are incorporated herein by reference in its entirety.

FIELD OF INVENTION

The present general inventive concept relates to an electrical power signal amplifier, and, more particularly, to a portable electrical power signal amplifier capable of generating a large range of power signals while maintaining high fidelity.

BACKGROUND

Electric meters are well known to measure electrical power consumption. Electric meters should be tested to ensure the meters are measuring power accurately. Electric meters can be tested using a load box to input a desired test signal into the meter, and then measure the performance of the meter to verify that the meter is performing properly. Challenges arise in meter testing when the relevant test signal is not readily available in the field and when the relevant test signal is associated with a high voltage environment. Test sites can also be subject to large amounts of electronic noise, hindering testing stability and accuracy. Moreover, conventional load boxes are typically rather large and cumbersome, making it difficult for a technician to easily carry and transport the load box to a particular testing site.

As such, there exists a need for a portable power signal generator that is capable of generating a large range of signals for varied and thorough testing of electric meters in the field, and which maintain fidelity whether the generated test signals are very low or very high. This application is related to co-pending application "Self-Contained Power Signal Generation System For Electricity Meter Testing," U.S. application Ser. No. 16/148,997, filed on Oct. 1, 2018, which is incorporated herein by reference in its entirety.

SUMMARY OF INVENTION

Example embodiments of the present general inventive concept may provide a method and system to generate a power signal, including summing a non-inverted reference signal and an inverted feedback signal to output a non-inverted first summation signal, and summing an inverted reference signal and a non-inverted feedback signal to output an inverted second summation signal. The first summation signal may be received at a non-inverted input of a differential power output driver, with the second summation signal being received at an inverted input of the differential power output driver. The differential power output driver can output a non-inverted power signal to a first terminal of an impedance load from a non-inverted output of the differential power output driver, and output an inverted power signal to a second terminal of the load from an inverted output of the differential power output driver. The non-inverted power signal is also supplied as the non-inverted feedback signal, and the inverted power signal is also supplied as the inverted feedback signal.

Example embodiments of the present general inventive concept may be achieved by providing a power signal generator including a first summation unit configured to sum a non-inverted reference signal and an inverted feedback signal, and to output a non-inverted summation signal representing a sum of the non-inverted reference signal and the inverted feedback signal, a second summation unit configured to sum an inverted reference signal and a non-inverted feedback signal, and to output an inverted summation signal representing a sum of the inverted reference signal and the non-inverted feedback signal, a differential input/output amplifier configured to receive the non-inverted summation signal and the inverted summation signal and to output a non-inverted amplified signal and an inverted amplified signal, and a differential power output driver configured to receive the non-inverted amplified signal and the inverted amplified signal and to output a non-inverted power signal and an inverted power signal, wherein the non-inverted power signal is applied to a first terminal of an impedance load and is presented to the second summation unit as the non-inverted feedback signal, and wherein the inverted power signal is applied to a second terminal of the impedance load and is presented to the first summation unit as the inverted feedback signal.

Example embodiments of the present general inventive concept may be achieved by providing a power signal generator including a first summation unit configured to receive a non-inverted reference signal and an inverted feedback signal, and to output a non-inverted first summation signal, a second summation unit configured to receive an inverted reference signal and a non-inverted feedback signal, and to output an inverted second summation signal, and a differential power output driver configured with a non-inverted input to receive the first summation signal, an inverted input to receive the second summation signal, a non-inverted output to output a non-inverted power signal to a first terminal of an impedance load, and an inverted output to output an inverted power signal to a second terminal of the impedance load, wherein the non-inverted power signal is supplied to the second summation unit as the non-inverted feedback signal, and the inverted power signal is supplied to the first summation unit as the inverted feedback signal.

Example embodiments of the present general inventive concept may be achieved by providing a method of generating a power signal, the method including summing, with a first summation unit, a non-inverted reference signal and an inverted feedback signal, and outputting a non-inverted first summation signal, summing, with a second summation unit, an inverted reference signal and a non-inverted feedback signal, and outputting an inverted second summation signal, receiving the first summation signal at a non-inverted input of a differential power output driver, and the second summation signal at an inverted input of the differential power output driver, outputting a non-inverted power signal to a first terminal of an impedance load from a non-inverted output of the differential power output driver, and outputting an inverted power signal to a second terminal of the impedance load from an inverted output of the differential power output driver, supplying the non-inverted power signal to the second summation unit as the non-inverted feedback signal, and supplying the inverted power signal to the first summation unit as the inverted feedback signal.

Example embodiments of the present general inventive concept can be achieved by providing a signal generation system for meter testing, including a digital signal generator to generate a digital test signal, a digital-to-analog converter to convert the digital test signal to an analog test signal, a signal converter to convert the analog test signal to a differential pair of signals corresponding to the analog test signal, and a power signal generator including: an input module to receive the differential pair of signals; an amplifier to amplify the differential pair of test signals; and an output module to output an output differential pair of signals to a load, to feed back a proportional representation of the output differential pair of signals to the input module, and to receive the amplified differential pair of signals from the amplifier.

Example embodiments can provide a 3-phase, 5 amp AC current source that is wholly battery powered, and may be housed in a portable handheld case.

Additional features and embodiments of the present general inventive concept will be set forth in part in the description which follows, and, in part, will be obvious from the description, or may be learned by practice of the present general inventive concept.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Figure 1:
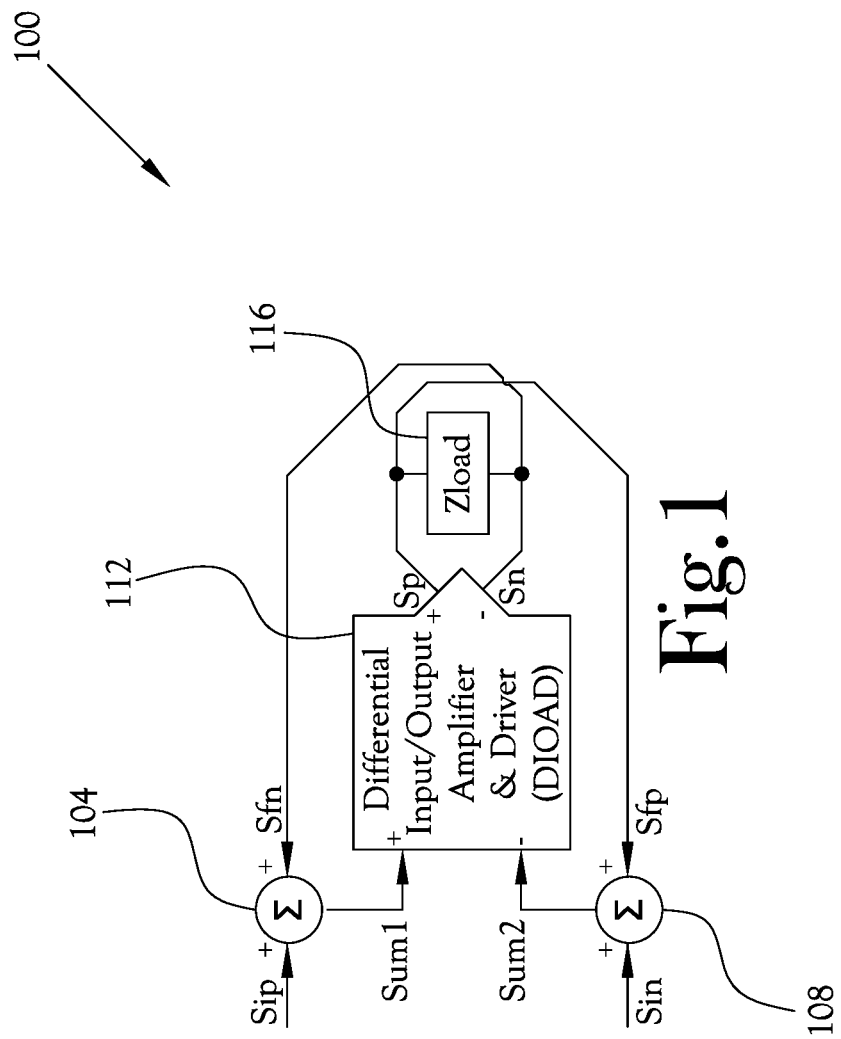
FIG. 1 illustrates a power signal generator according to an example embodiment of the present general inventive concept.

Reference will now be made to the example embodiments of the present general inventive concept, examples of which are illustrated in the accompanying drawings and illustrations. The example embodiments are described herein in order to explain the present general inventive concept by referring to the figures.

The following detailed description is provided to assist the reader in gaining a comprehensive understanding of the structures and fabrication techniques described herein. Accordingly, various changes, modification, and equivalents of the structures and fabrication techniques described herein will be suggested to those of ordinary skill in the art. The progression of fabrication operations described are merely examples, however, and the sequence type of operations is not limited to that set forth herein and may be changed as is known in the art, with the exception of operations necessarily occurring in a certain order. Also, description of well-known functions and constructions may be omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the example embodiments described herein, the term "summation unit" or "summer" may refer to any component or circuitry configured to receive input signals and output one or more summation signals representative of the input signals. Examples of such summation units may include a summing amplifier, differential summing amplifier, summing inverter, scaling summing amplifier, adder, or other known or later developed elements used in the electronics industry to achieve the same, similar, or equivalent results, and which would be readily recognized by one of ordinary skill in the art.

Various example embodiments of the present general inventive concept may generally provide a system for testing electrical meters, and, more particularly, to a portable, battery operated capable load box for testing electrical meters. Example embodiments of the present general inventive concept may relate to an electrical power amplifier capable of generating electrical signals that can be ranged in magnitude from near zero to, more importantly, large levels while maintaining high fidelity as compared to an arbitrary waveform of a small power signal reference input. Example applications may include generation of signals similar to various electrical power signal waveforms that are commonly associated with various electrical loads.

Various example embodiments of present general inventive concept described herein may be understood fundamentally as a relatively high power test signal source, although several signal levels from very low to very high may be employed. The electric power industry and various descriptions used herein identify this type of device as a "Load Box," which may seem confusing to persons trained in the general art of sourcing power to a load. As a point of clarification, the load box reference arises from the perspective that a power meter or power measuring device is measuring the power that is supplied to the customer and is causing an increase in the loading on the electric power generation system from the utility company. The load that is drawn by the customer is emulated by a power signal generator for the purpose of testing the accuracy of the measurement equipment when there are no power signals, or limited power signals, present to perform the required test. It is noted that although various devices and systems such as a load box may be referred to as a power signal generator, the term "power signal generator" is also used herein to refer more simply to the circuitry/component(s) processing the power signal, or may be used for circuitry/component(s) in general processing signals using differential feedback signals.

Conventional AC current and voltage signal source circuits typically require the use of relatively large, low frequency transformers to isolate a high voltage at the relatively low frequencies common to power signals. Alternatively, the higher efficiency and smaller size of power signal generators according to example embodiments of the present general inventive concept may be powered with relatively small, high-frequency isolation to allow the power signal generator circuitry to be directly coupled (i.e., dc coupled) to energized loads and allowed to float up to a high-voltage potential. Therefore, high-voltage signals can be isolated with smaller and lighter weight componentry.

To generate a precision output signal that can drive a range of substantially large, real-world loads is not a trivial matter. Power considerations become very important to the design of an instrument to accomplish such a goal. Size, cost, efficiency, heat dissipation considerations, weight, etc., are a few of the design attributes affected by the need to drive a substantial amount of power into a load with an arbitrary signal waveform and amplitude.

FIG. 1 illustrates a power signal generator according to an example embodiment of the present general inventive concept. The example embodiment of the power signal generator 100 illustrated in FIG. 1, which is a fully differential power amplifier, receives a pair of reference signals Sip and Sin and processes the reference signals to be applied to a load Zload for testing. While the load to be tested is not part of the power signal generator, it is illustrated in many of the drawings herein to aid in understanding of other components, connections, etc., of the example power signal generator embodiments. The arbitrary electrical signals Sip and Sin are a differential pair, i.e., Sin is substantially equal in magnitude and inverted with respect to Sip. As discussed herein, these arbitrary electrical signals may be generated by componentry included in a power signal generator and/or system according to the present general inventive concept, or may be delivered from a device or system outside such a generator and/or system. In the example embodiment illustrated in FIG. 1, a first weighted summation unit 104 receives the non-inverted reference signal Sip and an inverted feedback signal Sfn, which is fed back from processing in the power signal generator 100 and is discussed further herein, and outputs a first summation signal Sum1. A second weighted summation unit 108 receives the inverted reference signal Sin and a non-inverted feedback signal Sfp, which is also fed back from processing in the power signal generator 100 and is discussed further herein, and outputs a second summation signal Sum2. The weighting of summation units such as these may have a weighting greater than unity, less than unity, or unity. The first and second weighted summation units have respective scaling coefficients (including engineering unit conversion when applicable) Xfn and Xfp that control the magnitude, as well as phase in some example embodiments, of Sfn and Sfp, respectively, with respect to Sip and Sin, respectively. In the example embodiment illustrated in FIG. 1, the first summation signal Sum1 is equal to (Sip+Sfn/Xfn), and the second summation signal Sum2 is equal to (Sin+Sfp/Xfp). It is understood that various example embodiments of the present general inventive concept may include more or fewer components than those illustrated in the drawings herein, and/or components combined in different configurations, without departing from the scope of the present general inventive concept. For example, the differential input and output amplifier and driver discussed herein in regard to the example embodiment of FIG. 1 may be implemented as two or more components such as a differential power output driver and differential input/output amplifier, similar to other example embodiments described herein. A host of other such configurations are possible without departing from the scope of the present general inventive concept.

A differential input and output amplifier and driver (DIOAD) 112 receives the first summation signal Sum1 output by the first weighted summation unit 104 at a non-inverted input, and receives the second summation signal Sum2 output by the second weighted summation unit 108 at an inverted input. After processing the received signals Sum1 and Sum2, as discussed further in the descriptions herein, the DIOAD 112 outputs a non-inverted power signal Sp to be applied to a first terminal of an impedance load (Zload) 116, and outputs an inverted power signal Sn to be applied to a second terminal of the load Zload 116. The non-inverted power signal Sp is also presented to the second summation unit 108 as the non-inverted feedback signal Sfp, and the inverted power signal Sn is also presented to the first summation unit 104 as the inverted feedback signal Sfn. The arbitrary electrical signals Sfp and Sfn are also a differential pair associated with the load Zload 116 and are controlled by the system operation to be substantially equal to Sip*Xfn and Sin*Xfp, respectively, as will be demonstrated forthwith. The DIOAD 112 has signal gains Afdin and Afdip, which are transfer functions that describe the responses of the differential output signal Sfp−Sfn to the individual single-ended input summed signals Sip+Sfn/Xfn (Sum1) and Sin+Sfp/Xfp (Sum2).

An expression is given below for the overall closed-loop transfer function of the example embodiment of the power signal generator illustrated in FIG. 1. This transfer function produces the differential output signal Sfp−Sfn controlled to substantially correspond with the differential input signal Sip−Sin.

$$\frac{Sfp - Sfn}{Sip - Sin} = \left(\frac{Sfp - Sfn}{Sip - Sin}\right)_{Ideal} \cdot \frac{-\text{Tloop\_s}}{1 - \text{Tloop\_s}}$$

For the expression above:

$$\left(\frac{Sfp - Sfn}{Sip - Sin}\right)_{Ideal} = \frac{Xfp + Xfn}{2} = Xfp = Xfn$$

$$\text{Tloop\_s} = \frac{Afdin - Afdip}{Xfp + Xfn}$$

$$Afdip = \frac{Sfp - Sfn}{Sip}$$

$$Afdin \frac{Sfp - Sfn}{Sin}$$

Note that the form of the uppermost of the above expressions is consistent with classical negative feedback theory. As can be seen from both the expression and the example embodiment illustrated in FIG. 1, the larger the magnitudes of the transfer functions Afdip and Afdin are, the smaller the outputs of the summation units will be, and therefore the output differential signal Sfp−Sfn will be more substantially equal to the input differential signal Sip−Sin multiplied by the ideal closed loop transfer function Xfp. Note that the signals of various example embodiments of the present general inventive concept can be any form of electrical signal.

Figure 2:
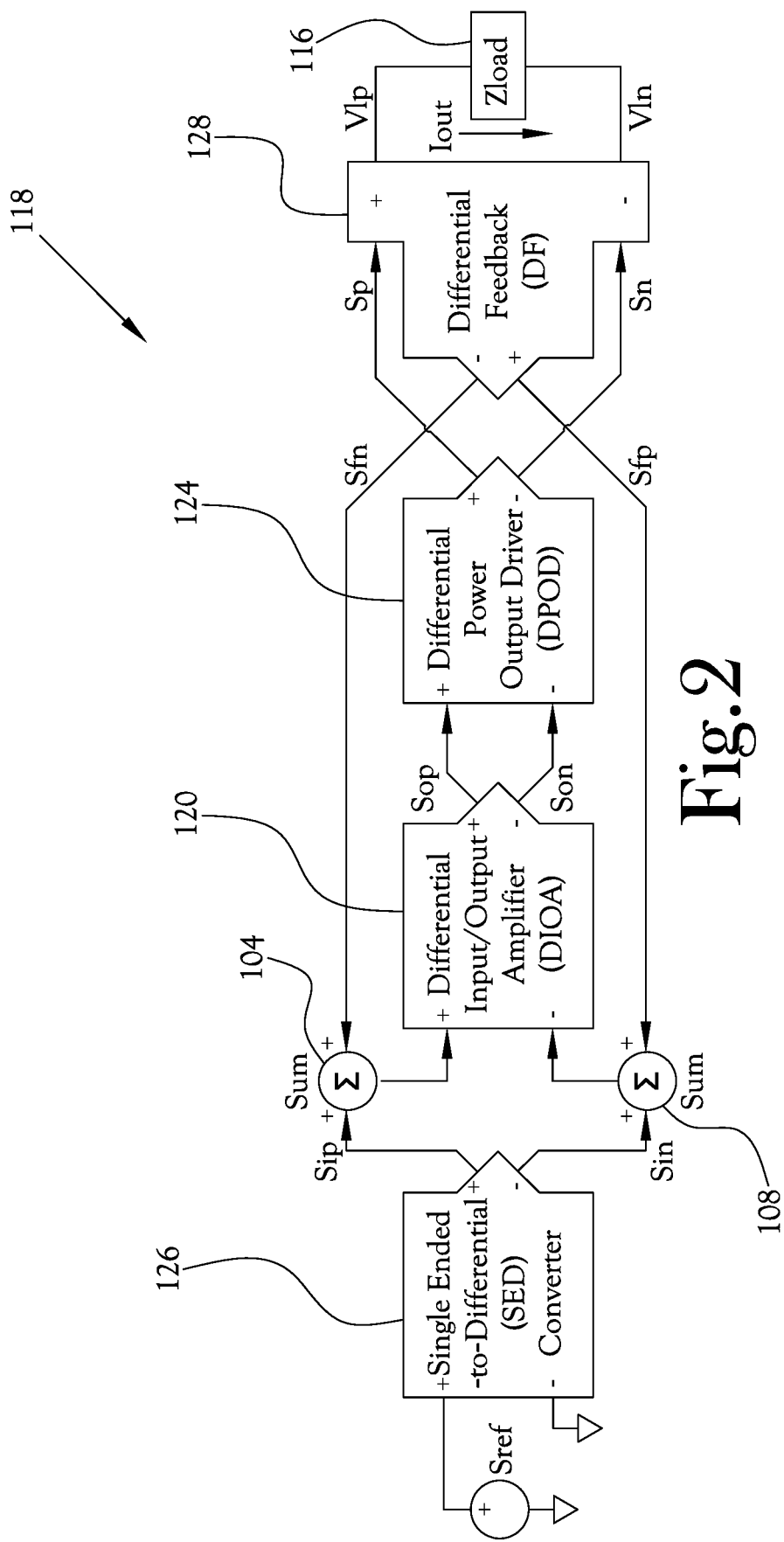
FIG. 2 illustrates a power signal generator according to another example embodiment of the present general inventive concept.

FIG. 2 illustrates a power signal generator according to another example embodiment of the present general inventive concept. In the example embodiment power signal generator 118 illustrated in FIG. 2, which is a fully differential negative feedback power amplifier, a reference signal Sref is supplied to a single ended-to-differential converter 126 to output the non-inverted input signal Sip and inverted input signal Sin respectively to the first and second summation units 104, 108. As with the example embodiment illustrated in FIG. 1, the arbitrary electrical signals Sip and Sin are a differential pair; i.e., Sin is substantially equal in magnitude and inverted in phase with respect to Sip. First and second summation units 104 and 108 output signals Sip+Sfn and Sin+Sfp are respectively applied to non-inverted and inverted inputs of a differential input/output amplifier (DIOA) 120. Electrical signals Sop and Son are also a differential pair of signals generated by the DIOA 120 in response to input signals Sip+Sfn and Sin+Sfp. The DIOA 120 provides forward amplification and, in various example embodiments, can be used to additionally provide compensation to stabilize the feedback loops. The DIOA 120 has signal gains Aodip and Aodin, which are transfer functions that describe the responses of the DIOA 120 differential output signal Sop−Son to the individual input signals Sip+Sfn and Sin+Sfp. The output signals Sp and Sn of the example embodiment of the power signal generator illustrated in FIG. 2 are another differential pair of signals generated by a differential power output driver (DPOD) 124 in response to the Sop−Son DIOA 120 differential output signal. The DPOD 124 can provide amplification and power as needed to drive the load Zload. The DPOD 124 has differential signal gain Adpod, which is a transfer function that describes the response of the DPOD 124 differential output signal Sp−Sn to the differential input signal Sop−Son from the DIOA 120.

A differential feedback unit (DF) 128 of the example embodiment power signal generator illustrated in FIG. 2 produces differential output feedback signals Sfp and Sfn in response to input differential signals Sp−Sn from the DPOD 124. The DF 128 functions to associate its input differential signals Sp−Sn with a parameter responsive to power in the load Zload 116 that is desired to be controlled. A non-exhaustive list of examples of such parameters that could be controlled may include physical quantities such as temperature of the load, current through the load, voltage across the load, the color of the load, the size of the load, etc. Resultingly, the DF 128 can be configured to have a transfer function such that the differential output signal Sfp−Sfn is optimally scaled, responsive to whatever parameter is to be controlled, and proportional to the input differential signal Sp−Sn.

An expression is given below for the overall closed-loop transfer function of the example power signal generator illustrated in FIG. 2 when configured to control a differential output voltage signal Vlp−Vin seen across the load Zload 116. This transfer function produces the differential output voltage signal Vlp−Vin controlled to substantially correspond with a single-ended reference signal input Sref.

$$\frac{Vlp - Vln}{Sref} = \left(\frac{Vlp - Vln}{Sref}\right)_{Ideal} \cdot \frac{-\text{Tloop\_vc}}{1 - \text{Tloop\_vc}}$$

For the expression above:

$$\left(\frac{Vlp - Vln}{Sref}\right)_{Ideal} = 2 \cdot \frac{\text{Aopip\_sed} \cdot Aodip + \text{Aonip\_sed} \cdot Aodin}{Xfn \cdot Aodip - Xfp \cdot Aodin}$$

$$\text{Tloop\_vc} = (Xfp \cdot Aodin - Xfn \cdot Aodip) \cdot \frac{Adpod}{Xp + Xn}$$

$$Xp = Xn = \frac{Sn}{Vn} = \frac{Sp}{Vp}$$

$$Xfp = Xfn = \frac{Sfn}{Vln} = \frac{Sfp}{Vlp}$$

$$Vn = Vln = -Vp = -Vlp$$

$$Adpod = \frac{Sp - Sn}{Sop - Son}$$

$$\text{Aopip\_sed} = \frac{Sip}{Sref}$$

$$\text{Aonip\_sed} = \frac{Sin}{Sref}$$

$$Aodip = \frac{Sop - Son}{Sip + Sfn}$$

$$Aodin = \frac{Sop - Son}{Sin + Sfp}$$

Note that the form of the uppermost of the above expressions is consistent with classical negative feedback theory. As can be seen from both the expression and the example embodiment illustrated in FIG. 2, the larger the magnitude of the transfer functions Aodip, Aodin, Adpod, Xfp, and Xfn are, the smaller the outputs of the summation units will be, and therefore the fed back differential signal Sfp−Sfn will be more substantially equal to the input differential signal Sip−Sin. This results in the above overall closed-loop transfer function (Vlp−Vin)/Sref, because the differential input signal Sip−Sin is a scaled version of Sref, and the differential fed back signal Sfp−Sfn is a scaled version of Vlp−Vln.

An expression is given below for the overall closed-loop transfer function of the example embodiment power signal generator illustrated in FIG. 2 when configured to control an output current signal Iout that flows through the load Zload 116. This transfer function produces the differential output current signal Iout controlled to substantially correspond with the single ended reference signal input Sref.

$$\frac{Iout}{Sref} = \left(\frac{Iout}{Sref}\right)_{Ideal} \cdot \frac{-\text{Tloop\_cc}}{1 - \text{Tloop\_cc}}$$

For the expression above:

$$\left(\frac{Iout}{Sref}\right)_{Ideal} = \frac{\text{Aopip\_sed} \cdot Aodip + \text{Aonip\_sed} \cdot Aodin}{Zfn \cdot Xfn \cdot Aodip - Zsp \cdot Xfp \cdot Aodin}$$

$$\text{Tloop\_cc} = 2 \cdot \frac{(Zsp \cdot Xfp \cdot Aodin - Zsn \cdot Xfn \cdot Aodip) \cdot Adpod}{(Xp + Xn) \cdot (Zsp + Zsn + Zload)}$$

$$Zload = \text{load\_impedance}$$

$$Zsp = \text{pos\_shunt\_impedance}$$

$$Zsn = \text{neg\_shunt\_impedance}$$

$$Xp = Xn = \frac{Sn}{Vn} = \frac{Sp}{Vp}$$

-continued $$Xfp = Xfn = \frac{Sfn}{Iout \cdot Zsn} = \frac{Sfp}{Iout \cdot Zsp}$$

$$Aopip\_sed = \frac{Sip}{Sref}$$

$$Aonip\_sed = \frac{Sin}{Sref}$$

$$Aodip = \frac{Sop - Son}{Sip + Sfn}$$

$$Aodin = \frac{Sop - Son}{Sin + Sfp}$$

$$Adpod = \frac{Sp - Sn}{Sop + Son}$$

Note that the form of the uppermost of the above expressions is consistent with classical negative feedback theory. As can again be seen from both the expression and the example embodiment illustrated in FIG. 2, the larger the magnitude of the transfer functions Aodip, Aodin, Adpod, Xfp, and Xfn, the smaller the outputs of the summation units will be, and therefore the fed back differential signal Sfp−Sfn will be more substantially equal to the input differential signals Sip−Sin. Again, this results in the above overall closed loop transfer function Iout/Sref, because the input differential signal Sip−Sin is a scaled version of Sref, and the fed back differential signal Sfp−Sfn is a scaled version of Iout.

Figure 3:
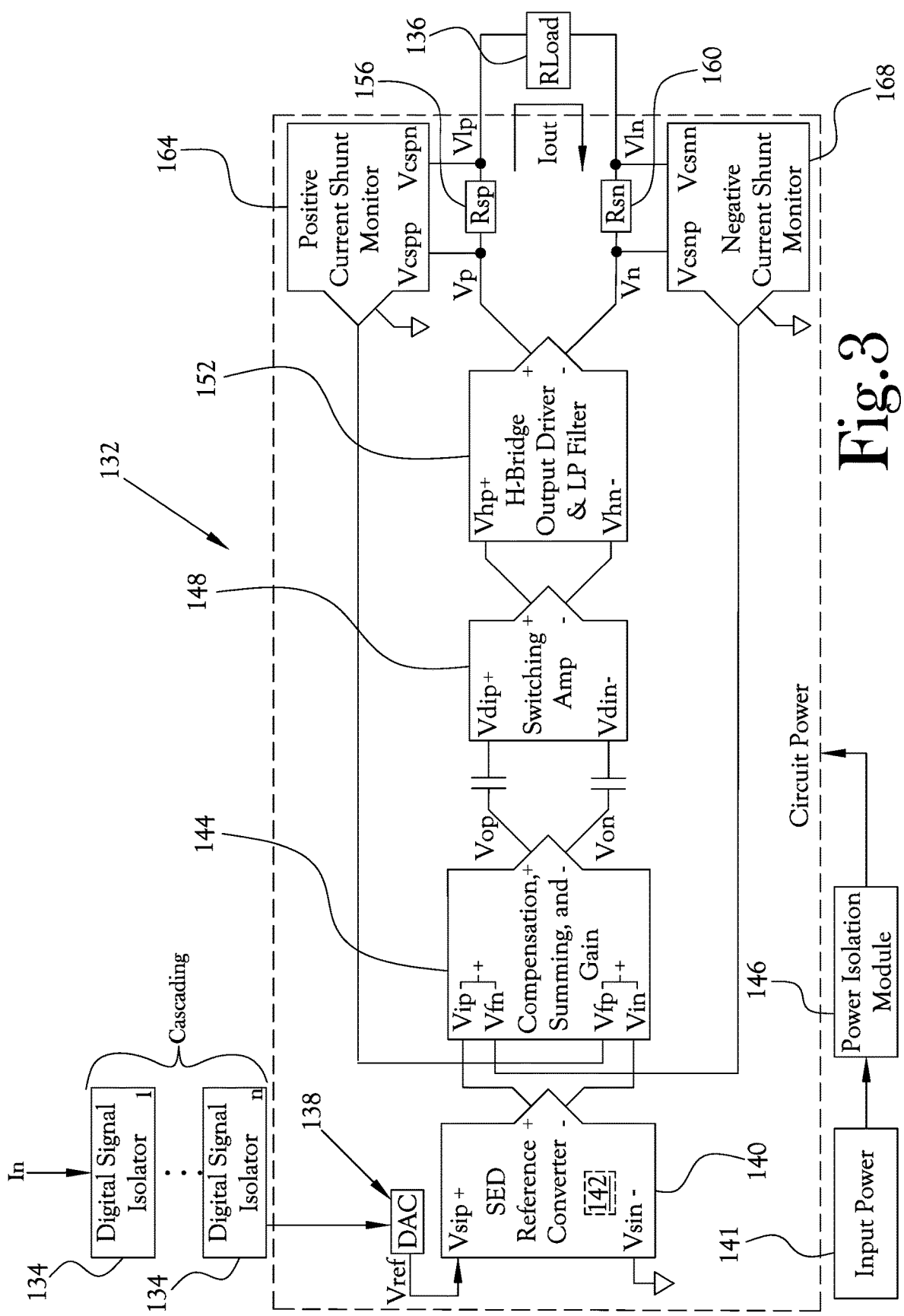
FIG. 3 illustrates a power signal generator according to yet another example embodiment of the present general inventive concept.

FIG. 3 illustrates a power signal generator according to yet another example embodiment of the present general inventive concept. In the example embodiment power signal generator 132 illustrated in FIG. 3, which is a fully differential negative feedback current output power amplifier, a current signal Iout is generated as a power output to be driven into a resistive load Rload 136. To accomplish this, an arbitrary digital input signal can be isolated from the power signal generator 132 by one or more cascading digital signal isolators 134. The input signal can be presented to a Digital-Analog-Converter (DAC) 138 to produce an analog waveform single-ended reference signal Vref which is then converted to two complementary reference signals, Vip and Vin, by a single-ended-to-differential (SED) reference converter 140 to form a single differential reference signal. As illustrated in FIG. 3, the SED reference converter 140 may include a filtering and amplifying transfer unit 142 to filter extraneous noise from and amplify the analog waveform single-ended reference signal. This differential signal is presented to a differential input and output amplifier (DIOA) 144 that is a signal-conditioning amplifier to sum reference (Vip and Vin) and feedback (Vfn and Vfp) signals, appropriately scale the summed signals, and provide compensation for the stability of the feedback loops. The outputs of the DIOA 144, Vop and Von, are then ac coupled into the differential input of a class D or switching amplifier 148. The switching amplifier 148 creates switching signals that are, for example, pulse width modulated (PWM) versions of its output. These PWM signals are used to control the gate-drive circuits in an output driver 152 that may be implemented, for example, as a full H-bridge power output stage. The output signals of the H-bridge power output stage may be low-pass filtered using a pair of LC low-pass filters in order to extract the signals of interest, Vp and Vn, from the switching signals and present the final arbitrary waveform output current Iout to the load being driven. The output current Iout may be sensed using a pair of shunt resistors, Rsp 156 and Rsn 160. In this example embodiment, these sensed current signals are converted to voltage inputs of a current shunt monitor pair 164, 168 and amplified through the differential input amplifiers of the respective current shunt monitors 164, 168 to condition the feedback signals, Vfp and Vfn, to have proper scaling, low noise, and high precision. These feedback signals Vfp and Vfn are presented to the summing input of the DIOA 144 signal-conditioning stage. In order to have negative feedback, an odd number of inversions may be provided around a given feedback circuit's loop. The single inversion used in the example embodiment of the present general inventive concept illustrated in FIG. 3 is performed by presenting the negative output signal of the feedback Vfn to the summing input of the DIOA 144 that is presented to the positive input Vip, and the positive output signal of the feedback Vfp to the summing input presented to the negative input Vin. As illustrated in FIG. 3, an input power 141 may be provided to a power isolation module 146 to power the power signal generator 132.

In the example embodiment illustrated in FIG. 3, a single-ended reference signal Vref that is referenced to a circuit common potential is presented to the SED reference converter 140 as an analog waveform. The SED reference converter 140 outputs a scaled and filtered differential pair output that represents the original single-ended reference waveform. The differential pair output form two separate common-potential-referenced signals, Vip and Vin, that have equivalent amplitude and inverted phase from one another.

In an example embodiment of a SED converter the reference signal may have an output signal differential gain of unity, meaning that half the amplitude of the original reference signal will be on each of the two outputs so that the output differential signal has the same magnitude as the original reference signal. The SED reference converter stage can employ a larger or smaller gain than unity, as well as conditioning the reference signal with noise filtering or other wave-shaping transfer functions. An example embodiment of the present general inventive concept may employ a fully-differential, multi-pole Bessel filter to reduce noise and preserve the shape of the waveform, thereby providing a good linearity over frequency. This example embodiment may also utilize a differential gain of two such that the gain from the single-ended input to each of the outputs is unity, non-inverting and inverting for Vip and Vin, respectively. Using a differential gain of two in the SED reference converter stage substantially doubles the dynamic range of the input signals to the DIOA 144, improving the signal-to-noise ratio of the reference signals while using the same supply voltages as the SED reference converter stage 140.

In the example embodiment illustrated in FIG. 3, the two common-potential-referenced signals from the SED reference converter 140 are presented to the DIOA 144 signal-conditioning stage as a differential input. Vip and Vin are individually summed with respectively inverted feedback signals as the input signals to this stage. The DIOA 144 amplifier provides gain to the summed input signals to be presented to the switching amplifier 148 inputs as Vop and Von. Since this amplifier stage is within the differential negative feedback loops, the DIOA 144 closed-loop gain cascades with the gain of the switching amplifier 148 gain and the output driver stage 152 to function as the open loop gain of the feedback in this example embodiment of the present general inventive concept. In general, negative feedback circuits benefit from as large of an open loop gain as possible while maintaining loop stability. Large open-loop gain allows the practical amplifier models to operate more closely to ideal amplifier operation. This large open-loop gain assists in providing good load regulation, mitigating noise effects, and providing a precisely scaled version of the reference signal at the output. Since there are various noise sources in a multi-stage amplifier circuit, providing the most gain closest to the input signals as possible is beneficial, so that the smallest amount of circuit noise is subjected to the largest amount of gain in the forward path. If desired, the DIOA 144 signal-conditioning amplifier in this example embodiment can also be readily configured to employ active, multi-pole filtering.

The DIOA 144 stage is also where the feedback loops are compensated for stable operation. In various example embodiments, additional circuit elements may be utilized in this stage to employ differential, pole-zero compensation in the transfer function to ensure that adequate phase margin is maintained for circuit operation. However, the stability of multiple feedback loops of a fully-differential design is complex to analyze and optimize. As always in negative feedback circuit design, it may be beneficial to engineer the feedback loop for optimum speed and stability for proper function and minimum noise superposition onto the output. Such engineering is non-trivial as it comprises a strategic combination of experiment and theoretical analysis. The details of that work are beyond the scope of this disclosure, and well known to persons trained in the art, and are therefore not described here.

In this example embodiment of the present general inventive concept, the signals conditioned by the DIOA 144 stage, Vop and Von, are presented to the input of the switching amplifier 148 stage. Due to the internal design of the switching amplifier 148 used in this example embodiment, the input signals presented to the switching amplifier are coupled to the inputs so as to avoid upsetting the biasing and feedback circuits of the switching amplifier 148. In the present example embodiment, capacitive ac coupling is employed to provide the input signals to the switching amplifier 148 stage. The switching amplifier 148 may utilize switching signals at frequencies higher than the output signal frequencies to construct an output signal that is comprised of a composite signal containing the desired output waveform signal and the higher frequency switching signals. The switching signals may be conditioned together with the input signals to create modulated signals, Vhp and Vhn, intended to be used to either drive directly or be used in creating gate-drive control signals to control the operation of the output stage. One such type of modulated signal that may be used in this example embodiment is pulse-width modulation. In the example embodiment illustrated in FIG. 3, the output stage of the switching amplifier 148 may be comprised of a full H-bridge topology with built-in power MOSFET transistors that are contained on the same substrate as the control circuitry of the switching amplifier 148. If this output stage has adequate power drive, it can be directly employed as the power output driver of various example embodiments of the present general inventive concept. Since off-the-shelf chip components may be utilized in this example embodiment, the output devices may be inadequate to provide the desired amount of power desired for the design, so a power output driver stage may be employed to provide substantially more output power than the switching amplifier might otherwise provide. The signals generated by the switching amplifier 148 stage may be presented to additional gate drive circuitry to operate the output power stage power MOSFET transistors with substantially more capability to provide power to the load. Output stage transistors are not required to be any specific type of power transistor, but the way they are driven to be turned on and off appropriately may be determined by the type used. In this example embodiment of the present general inventive concept, complementary P-channel and N-channel MOSFETs are used in the power output stage. Various other example embodiments of the present general inventive concept could alternatively employ, for example, all N-channel MOSFETs. The additional gate-drive circuitry used for proper operation between the various implementations could certainly be different; however, these differences do not change the overall goal of the present general inventive concept.

The switching amplifier 148 and the additional power output stage are both portions of the forward path where additional gain can be employed, increasing the total effective open-loop gain of this example embodiment of the present general inventive concept. In this example embodiment, an additional voltage gain of ten is factored into the total open-loop gain from the switching amplifier 148 gain. The output stage may have a voltage gain of unity in this example embodiment due to practical design limitations of cost, size, and complexity of the power supplies being used. In addition to preserving the overall open-loop voltage gain of the power amplifier with a gain factor of unity, another beneficial purpose of the output stage of this embodiment is to provide high current gain evidenced by the output stage characteristic of being capable of supplying substantially more current to the load than that capable of the preceding switching amp output.

In various example embodiments of the present general inventive concept, the SED reference converter 140 and the DIOA signal-conditioning amplifier 144 may be powered from the same single supply, while the switching amplifier 148 and power output driver 152 stage may have a separate single supply voltage. Various other example embodiments of the present general inventive concept could have all circuits powered from a single supply if more practical. One reason the present example embodiment may use multiple supply voltages is to accommodate the readily available op-amps and switching amplifiers that may be desired for use. If the power setup accommodated such, the signal conditioning amplifiers, switching amplifiers, and/or power output stage could also be implemented using bipolar supplies in order to increase the signal dynamic range and optimize efficiency. In the case of the switching amplifier 148, using bipolar supply voltages could increase the complexity of the gate drive topology of the power output stage.

Since the output signals applied to the impedance load Rload 136 that are produced by the output power stage 152 are modulated versions of the input signals presented to the switching amplifier 148, the signals are therein demodulated. Sometimes the type of load being driven can demodulate based on the nature of the load and the signals of interest, and thus such a demodulation function is not needed. In the example embodiment of the present general inventive concept illustrated in FIG. 3, the higher frequency switching signals are removed from the signals desired, Vp and Vn, to be presented to the load Rload 136. The demodulation in this example embodiment can be accomplished with a differential LC low-pass filter that substantially blocks the switching signals from being presented to the load. Adding series resistances to increase the equivalent series resistances of the capacitors that comprise the LC filters can assist in compensating the loop stability transfer function by changing the resonance characteristics created by the LC networks.

The example embodiment illustrated in FIG. 3 employs an output current signal, and therefore, current-sensing methods are employed in order to present the voltage feedback signals to the summing inputs of the DIOA 144 signal-conditioning amplifier stage. While many various example current-sensing techniques could be employed, in this example embodiment, the pair of current-shunt resistors 156, 160 is employed to provide voltage input signals to the pair of current-monitor amplifiers 164, 168. These amplifiers 164, 168 can amplify, attenuate, and/or filter the output signals to properly scale them for the summing inputs of the DIOA amplifier 144. Since current-sensing resistors are typically very small to help minimize the inefficiency of power dissipation through the sensing mechanism, the voltage signals presented to the current monitor amplifiers are relatively small compared to the size that is more beneficial for the desired feedback signals. A precision gain may be applied through the zero-drift, differential input amplifiers used as the current monitor amplifiers 164, 168 to signal voltages Vp, Vlp, Vn, and Vin in order to produce the fed back single-ended signal voltages Vfp and Vfn submitted to the summing inputs of the DIOA 144 stage.

The fully-differential design of the present general inventive concept provides superior performance to the equivalent single-ended design by rejecting noise at the input, output, and power supply of the circuit. Fully-differential feedback is employed in this example embodiment of the present general inventive concept by having two separate sense resistors 156, 160, feedback amplifiers 164, 168, and fed back signals to the summing inputs of the DOIA 144. Load regulation and output amplitude over varying conditions could instead be attained with a single current sense method and/or a single feedback loop; however, a single-ended implementation would be substantially more susceptible to noise and common-mode effects. Differential feedback is more complicated to analyze, and can increase the cost and size of a design if not optimized. As the electronic component industry makes smaller and cheaper components, a differential design is much more practical to be employed for robust operation, low-noise, and precision designs. A balanced design based on symmetry helps provide inherent immunity to external noise and provides more common-mode rejection. Another benefit of the fully-differential design is that substantially twice the dynamic range and signal swing can be attained compared to the equivalent single-ended design for a given supply voltage. The differential design of this example embodiment also leverages the utilization of gain-setting resistors on the same substrate to provide better matching and tracking of the resistance values, increasing the performance benefits that result from balance and symmetry.

An expression is given below for the overall closed-loop transfer function of the example embodiment of the power signal generator illustrated in FIG. 3. This transfer function produces the output current signal/out controlled to substantially correspond with the reference signal input Vref.

$$\frac{Iout}{Vref} = \left(\frac{Iout}{Vref}\right)_{Ideal} \cdot \frac{-Tloop}{1 - Tloop}$$

For the expression above:

$$Tloop = \frac{Rsp \cdot Acsp \cdot Aodin - Rsn \cdot Acsn \cdot Aodip}{2 \cdot (Rsp + Rsn + Rload)} \cdot Acd \cdot \text{Aodid\_out}$$

-continued $$\left(\frac{Iout}{Vref}\right)_{Ideal} = \frac{\text{Aopip\_sed} \cdot Aodip + \text{Aonip\_sed} \cdot Aodin}{Rsn \cdot Acsn \cdot Aodip - Rsp \cdot Acsp \cdot Aodin}$$

$$Rload = \text{load\_resistance}$$

$$Rsp = \text{pos\_shunt\_res}$$

$$Rsn = \text{neg\_shunt\_res}$$

$$Acsp = \frac{Vfp}{Vp - Vlp}$$

$$Acsn = \frac{Vfn}{Vn - Vln}$$

$$\text{Aopip\_sed} = \frac{Vip}{Vsip}$$

$$\text{Aonip\_sed} = \frac{Vin}{Vsip}$$

$$Aodip = 2 \cdot \frac{Vop - Von}{Vip + Vfn}$$

$$Aodin = 2 \cdot \frac{Vop - Von}{Vip + Vfn}$$

$$Acd = \frac{Vhp - Vhn}{Vdip + Vdin}$$

$$\text{Aodid\_out} = \frac{Vp - Vn}{Vhp + Vhn}$$

Again, note that the form of the uppermost of the above expressions is consistent with classical negative feedback theory. The loop gain Tloop and the ideal closed-loop response appear within the expression in a manner well known to persons trained in the art. This form shows that the actual closed-loop gain will converge toward the ideal value as the loop gain Tloop becomes larger. Also note that, as expected, the overall Iout/Vref closed-loop response is determined largely by transfer functions of the modules comprising the feedback circuitry. In the descriptions herein, the terms module and unit may be used interchangeably.

Figure 4:
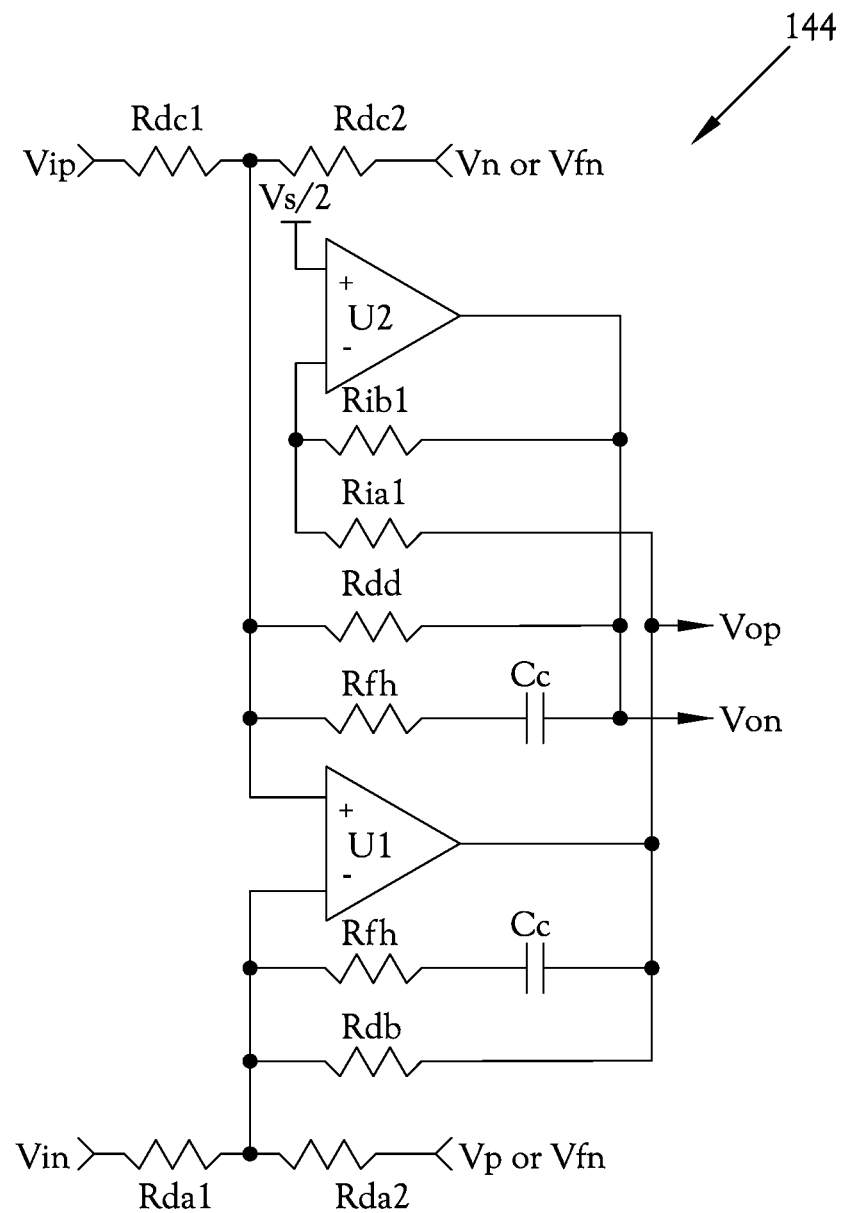
FIG. 4 illustrates the differential input and output amplifier (DIOA) of FIG. 3 according to an example embodiment of the present general inventive concept.

FIG. 4 illustrates the differential input and output amplifier (DIOA) of FIG. 3 according to an example embodiment of the present general inventive concept. Fully-differential operation of this example embodiment DIOA 144 is produced by matching the illustrated resistances and introducing new resistances as follows: Rdb=Rdd=Rf, Ria1=Rib2, Rda1=Rdc1=Ri1, and Rda2=Rdc2=Ri2. The absolute value of equivalent resistances Ria1 and Rib1 does not affect the differential transfer function within a large range of resistance. Resistances Ri1 and Ri2 can be different or the same values depending upon the differential response desired from any of the two pairs of inputs to the difference of the two outputs. Another variable a is also introduced, which represents the ratio of resistance Ri2 to the resistance Ri1 such that Ri2=a*Ri1. Thereby, this example embodiment of the DIOA 144 setup for differential operation involves three resistance values, resistances Rf, Ri1, and Ri2, consolidated down from the 6 shown in FIG. 4 that control operating gain.

Figure 5:
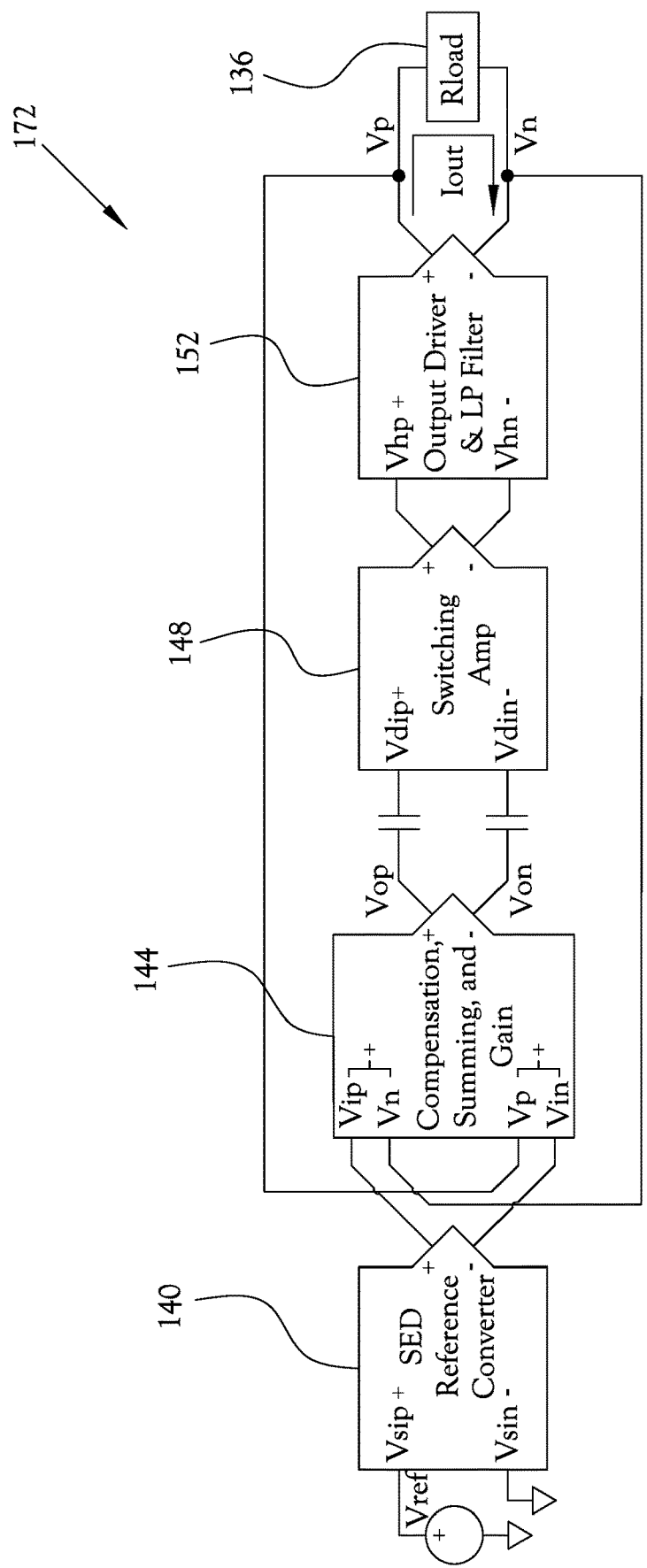
FIG. 5 illustrates a power signal generator according to still another example embodiment of the present general inventive concept.

FIG. 5 illustrates a power signal generator according to still another example embodiment of the present general inventive concept. The example embodiment illustrated in FIG. 5 is a fully differential negative feedback voltage output power amplifier. The Aodip and Aodin DIOA transfer functions defined in the previous expressions for the output current-controlled example embodiment of the power signal generator illustrated in FIG. 3 are redefined for the output voltage-controlled example embodiment illustrated in FIG. 5. The example embodiment power signal generator of FIG.

5 defines the Aodip and Aodin transfer functions for the special case of a=1; i.e., the case where Rda2=Rda1=Rdc2=Rdc1=Ri1=Ri2. This is a practical choice for output current-controlled operation due to there being no need to attenuate feedback signals in this case. Large currents can be monitored and converted to proportional voltage signals that are optimally sized; i.e., sized similarly to the reference signals Vip and Vin. However, in the case of an output voltage-controlled power signal generator embodiment such as the example embodiment illustrated in FIG. 5, the output voltages that are controlled and fed back to inputs of the DIOA 144 are typically large as these are power voltage signals. Therefore, substantial attenuation of these voltage signals may be desired and favored for circuit simplicity to be done at the inputs of the DIOA 144. Hence the possible desire for resistances Ri2 to be substantially larger than resistances Ri1 creating a desire for the aforementioned variable a>>1, the specific value of a depending upon the requirements of a given embodiment.

It is noted that the Thevenin equivalent resistance looking from the positive input of U1 of FIG. 4 up toward the union of Rdc1 and Rdc2 is the parallel combination of these resistances (because voltage sources are set to zero when determining the Thevenin equivalent resistance). This parallel combination may be referred to as resistance Ri. It is also noted that the Thevenin equivalent resistance looking from the negative input of U1 down toward the union of Rda1 and Rda2 is the same resistance and therefore is also referred to as resistance Ri.

Introduction of the Thevenin equivalent resistance Ri reduces the FIG. 4 circuit model to a single differential input DIOA. The difference between the Thevenin equivalent voltages, Vthp and Vthn, associated with the above-described Thevenin equivalent resistances of the Thevenin equivalent circuits represents the single differential input equivalent of the FIG. 5 DIOA embodiment. This difference between Thevenin equivalent voltages, Vthp−Vthn, is comprised of the four zero-potential referenced (single-ended) input voltages shown in the FIG. 5 circuit. The expressions for Vthp and Vthn are given below in terms of signal voltages Vip, Vin, Vp, Vn, and ratio variable a=Ri2/Ri1.

$$Vthp = \frac{Vip \cdot Rdc2 + Vn \cdot Rdc1}{Rdc1 + Rdc2} =$$
$$\frac{Vip \cdot Ri2 + Vn \cdot Ri1}{Ri1 + Ri2} = \frac{Vip \cdot Ri1 \cdot a + Vn \cdot Ri1}{Ri1 + Ri1 \cdot a} = \frac{Vip \cdot a + Vn}{1 + a}$$

$$Vthn = \frac{Vin \cdot Rda2 + Vp \cdot Rda1}{Rda1 + Rda2} =$$
$$\frac{Vin \cdot Ri2 + Vp \cdot Ri1}{Ri1 + Ri2} = \frac{Vin \cdot Ri1 \cdot a + Vp \cdot Ri1}{Ri1 + Ri1 \cdot a} = \frac{Vin \cdot a + Vp}{1 + a}$$

The values of the Aodip and Aodin transfer functions are computed in terms of resistance values and the ratio variable a using the Thevenin equivalent circuits of the FIG. 5 DIOA embodiment described above. Using Thevenin equivalent circuits, the Aodip and Aodin transfer functions are differential output voltage signal responses to single-ended input voltage signals and are given below. Recall that the Thevenin equivalent resistance Ri is the parallel combination of resistances Ri1 and Ri2 and therefore can be related to Ri1 as Ri=Ri1*a/(1+a).

$$\frac{Vop - Von}{Vthp} = Aodip = \frac{Rf}{Ri} = \frac{Rf}{Ri1} \cdot \frac{1+a}{a}$$

-continued $$\frac{Vop - Von}{Vthn} = Aodin = -\frac{Rf}{Ri} = -Aodip$$

Note that the two Rfh resistances and the two Cc capacitances in the FIG. 4 DIOA embodiment function to compensate the power signal generator by lowering the effective values of Rdb and Rdd (recall both are substantially equal to resistance Rf) at frequencies beyond operating such that a pole leading a zero is produced in the loop gain Tloop magnitude vs. frequency. This is one method to stabilize the power signal generator from an increase in the phase margin due to a reduction in the frequency where the loop gain magnitude dips below unity in proportion to the ratio of the resulting pole and zero frequencies.

An expression is given below for the overall closed-loop transfer function of the example embodiment power signal generator illustrated in FIG. 5. This transfer function produces the differential output voltage signal Vp−Vn controlled to substantially correspond with a single-ended reference signal input Vref. Note that Aodip and Aodin are defined directly above for the more general case of an example embodiment of the present general inventive concept involving the ratio variable a.

$$\frac{Vp - Vn}{Vref} = \left(\frac{Vp - Vn}{Vref}\right)_{ideal} \cdot \frac{-Tloop\_v}{1 - Tloop\_v}$$

For the expression above:

$$\left(\frac{Vp - Vn}{Vref}\right)_{ideal} = 2 \cdot a \cdot \frac{Aopip\_sed \cdot Aodip + Aonip\_sed \cdot Aodin}{Aodip - Aodin}$$

$$Tloop\_v = \frac{1}{1+a} \cdot \frac{Aodin - Aodip}{2} \cdot Acd \cdot Aodid\_out$$

All other constituent transfer function terms in the above expressions for the example embodiment illustrated in FIG. 5 may be the same as defined in the foregoing with exceptions as noted.

Note yet again that the form of the uppermost of the above expressions is consistent with classical negative feedback theory. The loop gain Tloop_v and the ideal closed-loop response appear within the expression in a manner well known to persons trained in the art. This form shows that the actual closed-loop gain will converge toward the ideal value as the loop gain Tloop_v becomes larger. Also note that, as expected, the overall (Vp−Vn)/Vref closed-loop response may be determined largely by transfer functions of the modules comprising the feedback circuitry.

All of the expressions given above for the various example embodiments of the present general inventive concept are derived assuming the common-mode rejection ratio (CMRR) of the differential modules, including the DIOAD, DIOA, the DPOD, and DF, is substantially large so as to commonly have less than substantially 10 parts per million (ppm) of the effect from common-mode signals as compared to the effect due to differential signals at operating frequencies; i.e., this is commonly the case to frequencies exceeding approximately 10 kHz. Operating frequencies are defined as the range of frequencies in the Fourier Transform of the power signals to be generated. CMRR, as is well-known, is a transfer function that indicates the response of the differential amplifier to a common mode input signal; i.e., the input signal represented by the mathematical average of the non-inverting and inverting input signals. The CMRR will be substantially infinite so long as non-inverting and inverting differential gains such as Aodip and Aodin and scaling factors such as Xfp and Xfn are substantially equal in magnitude throughout the operating frequency range. This substantially large CMRR improves correspondence with the closed loop, ideal closed loop, and loop gain transfer function expressions provided above. The common-mode analysis of any embodiment is an important consideration of the design and will typically be performed in order for the circuit to be engineered to demonstrate minimal adverse effects from common-mode signals upon the circuit's operation. While the common-mode analysis has been performed along with the other information being described, the requirement of that work is well-known to those trained in the art and beyond the scope of this disclosure.

A high degree of signal fidelity is a significant characteristic for a power signal generator to employ in order to present a precise representation of the reference signal to the load. Many common amplifier circuits can produce significant amounts of unwanted signal distortion at the output if not properly designed. One type of such distortion in the signal is harmonic distortion. Harmonic distortion can arise from non-linearities in the amplifier circuit that introduce additional signal content to the desired output signals at frequencies other than the intended signal frequencies. A fully-differential power signal generator amplifier design reduces the possibility for harmonic distortion since the fully-differential design produces an inherent reduction of even-order harmonics. Since odd-order harmonics retain their sign in the difference of single-ended signals that produces the differential signals, their contribution to harmonic distortion is equivalent to a comparable single-ended design. However, since even-order harmonics have sign cancellation, when the difference of the two single-ended signals occurs to form the differential signals, the even-order harmonics tend to cancel. Since the magnitude of the harmonics will not be exactly the same value in realizable circuits, the ideal cancellation will result in a reduction of even-order harmonic distortion to magnitudes much smaller than the equivalent single-ended design.

Fully differential feedback also improves load regulation of the power signal generator of the present general inventive concept. Negative feedback amplifiers generally have good load regulation due to large forward gain, or open-loop gain. For example, when the load resistance Rload is increased in an embodiment for controlling output current through the load, the output voltage will rise in order to keep the current constant. This output voltage rise is produced within the amplifier by a proportional increase in the magnitude of the output signal from the summation unit of the amplifier. Consequently, this will also produce a relatively small decrease in controlled output current due to the finite, but substantially large, magnitude of open-loop gain. Generally, the ratio of the magnitudes of the output voltage signal to the summation unit output signal is substantially equal to the open-loop gain of the amplifier. Therefore, a higher open-loop gain magnitude will produce a smaller change in the summer output signal in order to regulate the output current, which in turn, produces a smaller change in the controlled output current. Fully balanced differential feedback amplifiers having two feedback loops and two summation units further improves this load regulation control characteristic of negative feedback amplifiers.

Use of isolated power to energize an embodiment of the power signal generator allows combining multiple isolated power signal generators to obtain a proportional increase in the magnitude, and therefore the total power, that can be delivered to a load Rload. For example, connecting embodiments of output voltage controlled power signal generator outputs in series will increase the total voltage that can be applied to a load Rload by a factor substantially equal to the number generators connected. Note that this also typically employs the use of signal isolators between the reference signal Sref source and the inputs of the power signal generators such that the power signal generator inputs are isolated from one another. An example embodiment of such isolation may use a digital-to analog converter (DAC) for each power generator as a source of the reference signal Sref directly connected to the input of the associated power signal generator, and may use digital signal isolators to isolate the DAC digital inputs from a common digital bus such that all reference signal sources produce the same reference signal substantially instantaneously.

Connecting example embodiments of output current controlled power signal generators in parallel can increase the total current that can be applied to a load Rload by a factor substantially equal to the number generators connected. Such an example embodiment can be energized with isolated power to allow the output of the power signal generator to float up to whatever voltage to which the load Rload may be energized. This can also be facilitated by the aforementioned isolation of digital signals associated with a DAC used as the source of reference signal Sref and connected to all the power generator inputs in parallel.

In similar fashion, multiple DPOD output stages energized with isolated power can be used to obtain a proportional increase in the magnitude, and therefore the total power, that can be delivered to a load Rload. For example, connecting example embodiments of output voltage controlled power signal generators having DPOD modules individually energized with isolated power and with their outputs connected in series can increase the total voltage that can be applied to a load Rload by a factor substantially equal to the number DPOD modules connected. Further, use of a switching amplifier ahead of the DPOD can allow digital signal isolators to be used to isolate the switching amplifier outputs from the DPOD inputs, preventing the need for isolated power to energize the preceding amplifier stages of this power signal generator example embodiment. Alternatively, connecting example embodiments of output current controlled power signal generators having DPOD modules energized individually or ganged with isolated power and with their outputs connected in parallel can increase the total current that can be applied to a load Rload by a factor substantially equal to the number of DPOD modules connected. Again, such an example embodiment of the associated power signal generator can be energized with the isolated power to allow the output of the power signal generator to float up to whatever voltage to which the load Rload may be energized. This can also be facilitated by the aforementioned isolation of digital signals associated with a DAC used as the source of reference signal Sref and connected to the power generator inputs. Other various combinations of portions or entire embodiments previously discussed could also be employed as a different example embodiment as a way to increase the total output power presented to a load Rload.

Various example embodiments of the present general inventive concept may be employed in an electric meter load box and system that includes features such as, for example, being battery-operated so as to remove the need for an external AC power source, using differential signals to reduce electronic noise and increase accuracy and stability of the test signal, using high-frequency switching to reduce the size and weight of the load box, and using signal isolation to improve accuracy of the test, protect equipment and personnel, and provide proper function. Different example embodiments of such a load box, system, and/or component circuitry may provide more or fewer of these example features without departing from the scope of the present general inventive concept.

Example embodiments of the present general inventive concept may be provided in a new and improved battery operated load box system, utilizing isolated differential signals to reduce electronic noise and increase accuracy and stability. Such a battery powered device may utilize high frequency DC-DC converters to power the waveform generating electronics, facilitating portability of the device by reducing the size and weight of the DC-DC power electronics by reducing the size of the transformer magnetics. Example embodiments can also incorporate switching amplifiers, which allows for smaller power devices in the amplifier output stages, further reducing the size of the device.

Such a battery powered device that includes example embodiments of the present general inventive concept may be configured to generate a test signal when the desired test signal is unavailable or difficult to connect, improving regulation, accuracy, and stability of the test signal in high noise environments. Such a battery powered device may also incorporate signal isolation providing features to isolate the user, input signal, and the input power electronics from the waveform generation circuitry.

Conventional AC current source circuits typically require the use of relatively large, low frequency transformers to isolate a high voltage, whereas devices incorporating example embodiments of the present general inventive concept may use relatively small, high frequency isolation to allow the test signal waveform circuitry to float up to a high-voltage potential, thereby isolating high voltage signals with smaller and lighter weight componentry.

For convenience of illustration, the drawings described herein typically illustrate a single phase implementation of a generated signal such as that of a typical 3-phase AC current source, but it is understood that similar implementations can be provided for the signal source for the other 2 phases, and it is also understood that similar constructions and concepts can be used to generate voltage or current signals. Although some testing applications, for example, utilize a sinusoidal current signal fixed at 60 Hz, the present general inventive concept is not limited to any particular type or frequency of test signal, and any number of different test signals and/or frequencies may be used, including but not limited to sawtooth waves, square waves, pulse signals, etc.

In various embodiments of load boxes or systems employing example embodiments of the present general inventive concept, an input signal may be a digitized version of the desired analog signal to be used for testing the meter equipment. As the signal delivered to the load by the differential output driver can be associated with high voltage, it can be important to isolate the input signal from the waveform generation circuit componentry. The digital input signal can be isolated from the power signal generator by one or more cascading digital signal isolators. The input signal can be presented to a Digital-Analog-Converter (DAC) to produce a single-ended analog version of the digital input signal, which in turn may be converted by the signal converter to differential (equal and opposite) analog signals. The difference between the input analog signals corresponds to the user's desired test signal to be delivered to the load.

Such cascaded digital signal isolators may be referred to as an isolation module to isolate the digital test signal, and may include at least a pair of the digital signal isolators. To help ensure the device meets IEC 61010-1, CAT IV 600V compliance, off the shelf digital signal isolators may be cascaded. A single off the shelf isolator may typically provide inadequate isolation needed to meet compliance, therefore two or more of the isolators may be cascaded to achieve the required isolated voltage. Two such isolators provide up to twice as much isolated voltage as that provided by only one of the isolators, and with very small components. Otherwise, the use of a larger isolator designed to isolate higher levels of voltage could detrimentally increase the size of the overall device/system. An off the shelf isolator was tested successfully with on-chip transformers used to create signal and power isolation.

The differential input signal pair may be provided to a differential summing amplifier of an example embodiment power signal generator. The differential summing amplifier may present the sum of the differential input signal and the differential feedback signals from the differential output driver to a differential switching amplifier. The differential switching amplifier amplifies and modulates the summation signal for presentation to the differential output driver in a form that minimizes power consumption, again minimizing the size of power devices and maximizing battery life. The differential output driver outputs the differential output signal to the load for testing. In this way, such an example embodiment system can provide test signals when there are none otherwise available. For example, such a device/system can operate as a 3-phase AC current source. The differential output driver may also utilize noise-canceling differential feedback to the differential summing amplifier to improve stability and accuracy of the differential output signals applied to the load. Here, substantially instantaneous, inverted, and proportional representations of the differential output signals are fed back to the differential summing amplifier, which serves to cancel noise, improve stability and accuracy, and reduce unwanted harmonics of the differential output signal used to test the load. The load may be directly coupled to the power signal generator (which may be fully isolated from earth), resulting in the differential output signals not being affected by likely load connections to earth. This keeps the differential signals between the differential output driver and the load the same.

As previously discussed, example embodiments of the present general inventive concept can provide a signal generation system for meter testing, including a digital signal generator according to various example embodiments of the present general inventive concept to generate a digital test signal, which may include a digital-to-analog converter to convert the digital test signal to an analog test signal, a signal converter to convert the analog test signal to a differential pair of signals corresponding to the analog test signal, and a power signal, or other such waveform, generator including: an input module to receive the differential pair of signals; an amplifier to amplify the differential pair of test signals; and an output module to output an output differential pair of signals to a load, to feed back a proportional representation of the output differential pair of signals to the input module, and to receive the amplified differential pair of signals from the amplifier. Example embodiments can provide a 3-phase, 5 amp AC current source that is wholly battery powered, and may be housed in a portable handheld case.

A differential amplifier can be used to increase common-mode noise rejection, thereby allowing better stabilization of the load box output, and matched resistor networks to provide better common-mode rejection. The differential signal input to the power signal generator, or otherwise waveform generation circuit, provides common mode noise rejection, which rejects the types of noise that occurs in real world applications. By responding only to the difference between the differential input signals, because the signal noise on both will provide a difference of zero, the noise is rejected, resulting in a more robust noise rejecting circuit. Differential digital-to-analog converters (DAC) are typically expensive and difficult to implement in real world applications. Example embodiments of the present general inventive concept may employ a single-ended-to-differential conversion circuit to allow a single-ended DAC output to be used differentially in the waveform source circuitry.

In some example embodiments the analog signal may be a differential voltage signal that looks like the current to be generated. From the input points of the input signals and throughout the current generation circuit to the load, all of the signal processing is purely differential. Thus, the input is differential, the feedback is differential, and the output is differential, and fully differential throughout the forward path, as well. Conventional circuitry providing such feedback typically provides single-ended feedback. The circuitry according to various example embodiments of the present general inventive concept, however, provides two virtually identical, substantially equal and opposite feedback paths from the differential output driver to the differential summing amplifier that preserve the common-mode rejection property in the feedback. The circuitry provides equivalent amounts of feedback to the input signals. Thus, whenever the output signal needs to be adjusted from the feedback, it is done equally and oppositely on both paths. This prevents common-mode noise from becoming a problem throughout the circuit. Such a configuration used with the aforementioned isolation of the power signal generator provides an output that is also purely differential. Thus, if the load, or impedance, is grounded to earth, it will not affect the integrity of the differential output signals, because if any one of the differential output signal currents is moving in one direction, the other signal current is substantially equal and moving in the opposite direction. No current will flow to ground through the load or otherwise be lost, regardless of the impedance of the load. The isolation of the signals and the conversion to differential signals allows such a device or system to take advantage of these substantially equal and opposite signals when encountering potentials on the order of ±20,000 volts.

In some embodiments, the currents measured by a device or system employing a power signal generator according to the present general inventive concept at the meter site are sinusoidal. However, as a present load box using such power signal generator as generally described herein can be a digitally based system, and therefore can produce most arbitrary waveforms that could be desired. This is desirable because AC power waveforms often have high amounts of noise up to 50th order harmonics. The latest ANSI C12 metering standard dictates certain waveforms that have to be created in testing meters, and so the device and system according to the present general inventive concept may be designed to generate not only a pure sinusoidal waveform, but also, for example, harmonics up to the $50^{th}$ order of, for example, 60 Hz.

Various example devices and/or systems employing a power signal generator according to the present general inventive concept may have a battery that not only operates the device or system itself, but also supplies the power dissipated in the load driven by sourced voltage and/or current being generated. Thus, to produce a 3-phase source, there may be three actual outputs of voltage and/or current, all produced by the onboard battery of the device or system. Typically, on a voltage source, a high resistance load is a very small load. Conversely, on a current source, a low resistance load is a very small load. If the current source load is zero ohms, no power is being dissipated. As the load grows larger, such as from 50 milliohms to 100 milliohms, then four times the real power is delivered to the load.

A battery used in such a device or system may be a 12-volt lithium battery having 3.1 amp-hours. Example embodiments of the general inventive concept may be powered from a utility line-connected power source as with typical larger and less efficient load box systems, a battery alone, or both. Various other example embodiments may employ a battery with different ratings according to the device needs and sound engineering judgement. Various example embodiments may also include a power electronics module, also referred to as a Power Isolation Module, to power the power signal generator circuit. The battery may provide the input power to the power isolation module, which can include a DC-DC converter configured to isolate large voltages, such as ±20,000 V. The power isolation module provides power to the power signal generation circuit, or power signal generator, enabling the power signal generation circuit to generate the interrogation (i.e., test) signal. Each phase of the 3-phase current source can be at a different potential at any given time, and may often be significantly higher than ground potential. Consequently, a 3-phase embodiment will produce isolated power for each phase. It is possible to isolate the power electronics from the test signal waveform generating circuitry by using high frequency transformers (e.g., 100 kHZ to 500 MHz). For example, high frequency transformers can be used in a DC-DC converter to isolate the power electronics from the power signal generator circuit, facilitating portability of the device by reducing the size and weight of the transformer magnetics relative to lower frequency transformers. In the power isolation componentry, a DC to AC conversion is made which produces a high frequency AC signal, and therefore can be isolated with a physically smaller transformer to produce the isolation of high frequency AC, and the AC signal is then transformed back to DC, which is the type of power supplied by the battery, and which cannot be passed by a transformer.

The higher frequency that is passed across the transformer, the smaller the magnetics of the transformer may be. The power and components of each phase are isolated so that all those loads may be driven at the different potentials without causing electrical problems in the circuitry. The phases are isolated from one another, and from ground. The use of a relatively small flyback transformer to isolate the power electronics allow a reduction in the size of magnetics and other parts that helps to decrease the size and weight of the entire device into a much more manageable and portable tool, and also allows the device to be battery powered.

The power signal generation circuit can function as a negative feedback amplifier. A transformer can be located in the power isolation componentry. Unlike traditional analog power transformers that step up either the current or voltage, the transforming in a device employing a power signal generator according to the present general inventive concept is instead provided by the amplifier. The isolation characteristic of the typical analog power transformer is replaced in such an example embodiment device by the digital isolator and power isolation module. By isolating at the power and digital signals, the device can be formed with smaller magnetic components, as opposed to isolating at the output. The device can run at a much higher frequency, which minimizes the size of the magnetics. Traditional power amplifiers running at 60 Hz require large magnetics and transformers. The example device may be configured to run at frequencies of tens of kHz or hundreds of MHz. The signal is again converted to DC on the isolated side. This may be implemented with a typical flyback DC-DC converter. Thus, DC power may be supplied to the power isolation componentry from the battery, and from the power isolation componentry to the current generation circuit, but a DC to AC conversion and isolation of the power occurs in the power isolation componentry before being transformed back to DC. Isolating the signal at 60 Hz would require a transformer that is too large for a readily portable device, but isolating at a much higher frequency, such as hundreds of kHz, which has multiple orders of magnitude larger, allows the device having a power signal generator according to the present general inventive concept to use a much smaller transformer, thus decreasing the overall size and weight of the device and making it much more user friendly in the portability and weight aspects to the technician. This is especially valuable when one considers that the size reduction is across three transformers, which is one for each phase of the load box signal. In modern power systems, a large concern is the harmonics that ride on the 60 Hz sinusoidal waveforms, and how they affect the meter's power measurement accuracy. The device is able to generate signals such as these to comply with the most recent ANSI standards for meter registration.

In the case of AC signals, it is desirable for the AC current source to have low noise and good linearity. Fully differential, multi-pole Bessel filters can be employed to reduce noise and preserve the shape of the waveform, thereby providing a good linearity over frequency.

Various example devices and systems including example embodiments of the present general inventive concept may employ paralleled multiple isolated current output stages to provide higher current output using components with decreased size, weight, and cost, compared with conventional devices. Example embodiments may include an AC current source that can provide three independent, fully isolated current outputs for true three-phase AC current source testing.

Example embodiments of the present general inventive concept may be provided in a system that may be used as an accessory to complement a meter site tester such as, for example, the PowerMaster® 3 Series hand-held 3-phase meter site tester. In combination with such a meter tester, a user will have the ability to perform 3-phase phantom load meter testing up to, for example, 5 A while implementing the new current harmonic waveforms from the ANSI C12.20 metering standard. In this method of testing, a meter tester such as the 3 Series can be used to measure the current and voltage that the meter is seeing from the load box, and the measurements from the meter and the 3 Series can be compared to see if the meter is accurately measuring the signals from the load box.

In addition, an example embodiment of the present general inventive concept may give the user the ability to perform an automated, user-selectable current transformer (CT) burden added test. The compact size of devices and/or systems employing an example embodiment of the present general inventive concept allows the subject device, the 3 Series meter site tester, and all standard accessories to be stored in the same carrying case, and add increased functionality to the 3 Series tester. Such increased functionality may include a battery powered current source requiring no external AC voltage, 3-phase phantom load testing, CT added burden testing, and self-contained lightweight packaging that includes storage of cables and probes. Various systems using example embodiments of the present general inventive concept may provide several features that make them a desirable alternative to conventional devices typically available, such features including: providing an electric meter load box in a smaller, more convenient device; providing a true one-case solution, containing the analyzer, cables, and probes all in one case; the ability to leave the cables connected to the analyzer device to reduce the amount of time hooking up cables at each site; having an internal battery to avoid requiring an auxiliary power source; improved reliability, load regulation, and shorter downtimes; and IEC 61010 safety certification. Various other features and/or advantages will be recognized in the descriptions of example embodiments of the present general inventive concept contained herein. Such a device and system using an example embodiment of the power signal generator according to the present general inventive concept may present enhanced functionality in a host of applications such as, for example, site verification; revenue protection; customer load meter testing; Wh, VARh, and VAh meter testing; forward and reverse energy flow testing; element testing; calibration verification; CT added burden testing; CT ratio testing; CT burden measurement; vector analysis; harmonic capture; waveform analysis; and so on.

Thus, various example embodiments of the present general inventive concept enable the production and use of a lightweight and economical device, or accessory, to allow utilities to perform phantom load ANSI meter tests on their transformer rated and self-contained sites, and perform burden added CT testing. Example embodiments offer true three phase current source up to 5 amps per phase for ANSI meter testing, and burden added up to 2 ohms in five steps for CT testing. The power signal generator is configurable for virtually any current and any power factor a user wants to test. In addition to Watthour testing, the accessory also allows testing for VARhour and VAhour. It also has the ability to perform meter testing under forward or reverse energy flow, and can test individual elements of the meter as well. The current source can also generate waveforms including purely sinusoidal waveforms and signals with harmonic conditions. The device is designed with CAT IV 600V safety compliance.

A variety of testing performed with embodiments of the present general inventive concept includes performing a true 3 phase ANSI meter test on a form 9S meter under the test points of full load, power factor, and light load. With the power signal generator according to an example embodiment of the present general inventive concept, such tests can be performed directly at the meter test switch in the field, eliminating the need to pull the meter and test it with an expensive meter test board. Such a device/system increases testing efficiency while also lowering cost.

As described and illustrated herein, example embodiments of the present general inventive concept can provide a signal generation system for meter testing, including a digital signal generator to generate a digital test signal, a digital to analog converter to convert the digital test signal to an analog test signal, a differential signal generator to convert the analog test signal to a differential pair of test signals corresponding to the analog test signal, and a power signal generator including: an input module to receive the differential pair of test signals; an amplifier to amplify the differential pair of test signals; and an output module to output the differential pair of output signals to a load, to feedback the differential pair of output signals to the input module, and to receive the amplified differential pair of test signals from the amplifier.

An example device or system incorporating an example embodiment of the present general inventive concept may be configured to generate and produce selectable values of current, up to 5 amps. While such device or system may be used when there is no customer current available, it may also be used in lieu of using the available current by bypassing the customer load, thus producing a more stable interrogation current. Another function of a device or system incorporating an example embodiment of the present general inventive concept may be the added burden testing, which is achieved by adding extra series resistance to the secondary side of the current transformer, thereby being able to determine how much added burden is necessary to make the current transformer move out of its compliance accuracy. To perform such added burden testing, such an example device may act as a multiplexor that switches different burdens to the current transformer at the site to measure the different accuracy effects. The device may have a series of resistors to allow different predetermined levels of burden to be selected and tested at the meter. Typically, the larger the added burden the more inaccuracy the added burden is likely to cause to a CT that may need to be replaced.

While most of the example embodiments of the present general inventive concept have been described in terms of AC current sources, the concept also applies to a voltage source. According to the duality concept of electricity and magnetism, equivalent circuits may be represented as Norton equivalent circuits for current sources (such as the Powermaster 3 Series embodiment example) and Thevenin equivalent circuits for voltage sources. Thus, various devices and/or systems incorporating example embodiments of signal generators according to the present general inventive concept encompass both voltage test signals and current test signals.

Various example embodiments of the present general inventive concept may be provided in a device and/or system with various specifications, including but not limited to, three direct inputs rated from 100 mA to 20 A RMS; an auxiliary power input rated from 120 to 240 VAC; a current source to provide an AC current through three outputs, each rated 100 mA to 5 A RMS max with a power factor of −1.00 to 1.00; a CT burden added test and is automated and user selectable at 0.1, 0.3, 0.5, 1.0, and 2.0 ohms; environmental operating tolerances including temperatures of −20 to 50 degrees Celsius, an operating humidity of <95% RH, non-condensing at 23 degrees Celsius; a 3100 mAh Li-ion battery having a 3 hour charging cycle at 0 to 40 degrees Celsius; a total package weight, including case and 3 series meter tester, of less than 20 pounds; safety features including isolation protection of IEC 61010-1 (2010), measurement category of CAT IV 600V, and a degree of protection of IP-40.

Various example embodiments of the present general inventive concept may be provided in example devices and/or systems that function as a burden and load box device/system having a current source of up to 5 A max and an added burden up to 2 ohms, while other example devices and/or systems may function as a load box only device/system having a 3-phase current source of up to 5 A per phase, or as a burden only device/system having an added burden up to 2 ohms, but various devices/systems incorporating the power signal generator of the present general inventive concept are not limited thereto.

Various example embodiments of the present general inventive concept may provide a power signal generator including a first summation unit configured to sum a non-inverted reference signal and an inverted feedback signal, and to output a non-inverted summation signal representing a sum of the non-inverted reference signal and the inverted feedback signal, a second summation unit configured to sum an inverted reference signal and a non-inverted feedback signal, and to output an inverted summation signal representing a sum of the inverted reference signal and the non-inverted feedback signal, a differential input/output amplifier configured to receive the non-inverted summation signal and the inverted summation signal and to output a non-inverted amplified signal and an inverted amplified signal, and a differential power output driver configured to receive the non-inverted amplified signal and the inverted amplified signal and to output a non-inverted power signal and an inverted power signal, wherein the non-inverted power signal is applied to a first terminal of an impedance load and is presented to the second summation unit as the non-inverted feedback signal, and wherein the inverted power signal is applied to a second terminal of the impedance load and is presented to the first summation unit as the inverted feedback signal. The power signal generator may further include a signal converter configured to convert an arbitrary analog waveform single-ended reference signal into a reference differential signal pair comprising the non-inverted reference signal and the inverted reference signal. The power signal generator may further include a differential feedback unit configured to apply the non-inverted power signal to the first terminal of the impedance load, to apply the inverted power signal to the second terminal of the impedance load, to output the non-inverted feedback signal to the second summation unit, and to output the inverted feedback signal to the first summation unit. The power signal generator may further include an isolated power electronics unit configured to supply power to the power signal generator. The power signal generator may further include a plurality of power signal generators configured to be connected, wholly or in part, to increase total power imparted to the impedance load. The non-inverted power signal and the inverted power signal may be an output power differential signal pair that form a power output current signal controlled in substantially instantaneous proportion to a reference differential signal pair comprising the non-inverted reference signal and the inverted reference signal. The non-inverted power signal and the inverted power signal may be an output power differential signal pair that form a power output voltage signal controlled in substantially instantaneous proportion to a reference differential signal pair comprising the non-inverted reference signal and the inverted reference signal. The power output current signal may have a selectable output rms magnitude range between substantially zero amps to approximately 50 amps or more. The power output voltage signal may have a selectable output rms magnitude range between substantially zero volts to approximately 600 volts or more. The power signal generator may further include a reference signal generator configured to output arbitrary signals, with harmonics up to or exceeding approximately the 50th order of 60 Hz or 50 Hz fundamentals, the arbitrary analog waveform single-ended reference signal being output from the reference signal generator. The isolated power electronics unit may be configured to separately supply isolated power to the differential power output driver. The power signal generator may further include a plurality of differential power output drivers configured to be connected to increase total power imparted to the impedance load. The differential input/output amplifier may be configured as a switching amplifier to provide greater power efficiency and decreased size of the power signal generator. The differential power output driver may include an H-bridge to provide greater power efficiency and decreased size of the power signal generator. The differential power output driver may include a differential filter to produce the non-inverted power signal and the inverted power signal. The differential power output driver may include a differential low-pass filter to produce the non-inverted power signal and the inverted power signal. The power signal generator may further include a compensation, summing, and gain differential input/output amplifier that includes the first summation unit and the second summation unit. The differential feedback unit may include a differential generating unit configured to generate the non-inverted feedback signal and the inverted feedback signal in proportion to a selectable output rms magnitude of the power output current signal that flows through the impedance load, and a differential current monitor amplifier pair configured to scale the non-inverted feedback signal and the inverted feedback signal. The differential generating unit may include a non-inverted output current shunt and an inverted output current shunt. The differential input/output amplifier may include an H-bridge to provide greater power efficiency and decreased size of the power signal generator. The signal converter may include a filtering and amplifying transfer unit to filter extraneous noise from and amplify the arbitrary analog waveform single-ended reference signal. An output signal produced between the first terminal and the second terminal of the impedance load may be a dc quantity.

Various example embodiments of the present general inventive concept may provide a power signal generator including a first summation unit configured to receive a non-inverted reference signal and an inverted feedback signal, and to output a non-inverted first summation signal, a second summation unit configured to receive an inverted reference signal and a non-inverted feedback signal, and to output an inverted second summation signal, and a differential power output driver configured with a non-inverted input to receive the first summation signal, an inverted input to receive the second summation signal, a non-inverted output to output a non-inverted power signal to a first terminal of an impedance load, and an inverted output to output an inverted power signal to a second terminal of the impedance load, wherein the non-inverted power signal is supplied to the second summation unit as the non-inverted feedback signal, and the inverted power signal is supplied to the first summation unit as the inverted feedback signal. The differential power output driver may be configured as a differential input/output amplifier and driver to amplify the received first and second summation signals. The power signal generator may further include a differential input/output amplifier configured to be in electrical communication with the first and second summation units and the differential power output driver to amplify the first and second summation signals before they are received at the differential power output driver. The power signal generator may further include a differential feedback unit configured to produce the non-inverted and inverted feedback signals as differential output feedback signals in response to the respective non-inverted and inverted power signals. The differential feedback unit may be configured to associate the non-inverted and inverted power signals with one or more parameters responsive to power in the impedance load. The one or more parameters may include temperature of the impedance load, current through the impedance load, voltage across the impedance load, color of the impedance load, size of the impedance load, or any combination thereof. The non-inverted reference signal and the inverted reference signal may be a reference differential signal pair. The power signal generator may further include a signal converter to convert an arbitrary analog waveform single-ended reference signal into the reference differential signal pair. The first and second summation units may be configured as weighted summation units with scaling coefficients to control a magnitude of the respective inverted and non-inverted feedback signals according to the respective non-inverted and inverted reference signals.

Various example embodiments of the present general inventive concept may provide various methods of using differential feedback as described with the various power signal generators and systems described herein. For example, various example embodiments may provide a method of generating a power signal, the method including summing, with a first summation unit, a non-inverted reference signal and an inverted feedback signal, and outputting a non-inverted first summation signal, summing, with a second summation unit, an inverted reference signal and a non-inverted feedback signal, and outputting an inverted second summation signal, receiving the first summation signal at a non-inverted input of a differential power output driver, and the second summation signal at an inverted input of the differential power output driver, outputting a non-inverted power signal to a first terminal of an impedance load from a non-inverted output of the differential power output driver, and outputting an inverted power signal to a second terminal of the impedance load from an inverted output of the differential power output driver, supplying the non-inverted power signal to the second summation unit as the non-inverted feedback signal, and supplying the inverted power signal to the first summation unit as the inverted feedback signal. The differential power output driver may be configured as a differential input/output amplifier and driver to amplify the received first and second summation signals. The method may further include amplifying the first and second summation signals by a differential input/output amplifier in electrical communication with the first and second summation units and the differential power output driver before the first and second summation signals are received at the differential power output driver. The method may further include producing, by a differential feedback unit, the non-inverted and inverted feedback signals as differential output feedback signals in response to the respective non-inverted and inverted power signals. The differential feedback unit may be configured to associate the non-inverted and inverted power signals with one or more parameters responsive to power in the impedance load. The one or more parameters may include temperature of the impedance load, current through the impedance load, voltage across the impedance load, color of the impedance load, size of the impedance load, or any combination thereof. The non-inverted reference signal and the inverted reference signal may be a reference differential signal pair. The method may further include converting, by a signal converter, an arbitrary analog waveform single-ended reference signal into the reference differential signal pair. The first and second summation units may be configured as weighted summation units with scaling coefficients to control a magnitude of the respective inverted and non-inverted feedback signals according to the respective non-inverted and inverted reference signals.

It is noted that the simplified diagrams and drawings do not illustrate all the various connections and assemblies of the various components, however, those skilled in the art will understand how to implement such connections and assemblies, based on the illustrated components, figures, and descriptions provided herein, using sound engineering judgment.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A power signal generator for verifying accuracy of power measurement equipment, the power measurement equipment being configured to measure an amount of power delivered from an electric utility company to an impedance load, the power signal generator comprising:
    a waveform generation circuit, comprising:
        a first summation unit configured to sum a non-inverted reference signal and an inverted feedback signal, and to output a non-inverted summation signal representing the sum of the non-inverted reference signal and the inverted feedback signal;
        a second summation unit configured to sum an inverted reference signal and a non-inverted feedback signal, and to output an inverted summation signal representing the sum of the inverted reference signal and the non-inverted feedback signal;
        a differential input/output amplifier configured to receive the non-inverted summation signal and the inverted summation signal and to output a non-inverted amplified signal and an inverted amplified signal; and
        a differential power output driver configured to receive the non-inverted amplified signal and the inverted amplified signal and to output a non-inverted power signal and an inverted power signal;
    an input signal isolation unit configured to isolate an input test signal from the waveform generation circuit; and
    a power isolation unit configured to isolate a source of operational power of the waveform generation circuit from the waveform generation circuit;
    wherein the non-inverted power signal is applied to a first terminal of an impedance load and is presented to the second summation unit as the non-inverted feedback signal, the non-inverted feedback signal being a proportional representation of the non-inverted power signal; and
    wherein the inverted power signal is applied to a second terminal of the impedance load and is presented to the first summation unit as the inverted feedback signal, the inverted feedback signal being a proportional representation of the inverted power signal.

2. The power signal generator of claim 1, wherein the waveform generation circuit further comprises a signal converter configured to convert an arbitrary analog waveform single-ended reference signal into a reference differential signal pair comprising the non-inverted reference signal and the inverted reference signal.

3. The power signal generator of claim 1, wherein the waveform generation circuit further comprises a differential feedback unit configured to apply the non-inverted power signal to the first terminal of the impedance load, to apply the inverted power signal to the second terminal of the impedance load, to output the non-inverted feedback signal to the second summation unit, and to output the inverted feedback signal to the first summation unit.

4. The power signal generator of claim 1, wherein the power isolation unit comprises an isolated power electronics unit configured to supply power to the waveform generation circuit.

5. The power signal generator of claim 1, wherein the waveform generation circuit further comprises a plurality of power signal generators configured to be connected, wholly or in part, to increase total power imparted to the impedance load.

6. The power signal generator of claim 1, wherein the non-inverted power signal and the inverted power signal are an output power differential signal pair that form a power output current signal controlled in substantially instantaneous proportion to a reference differential signal pair comprising the non-inverted reference signal and the inverted reference signal.

7. The power signal generator of claim 1, wherein the non-inverted power signal and the inverted power signal are an output power differential signal pair that form a power output voltage signal controlled in substantially instantaneous proportion to a reference differential signal pair comprising the non-inverted reference signal and the inverted reference signal.

8. The power signal generator of claim 6, wherein the power output current signal has a selectable output rms magnitude range between substantially zero amps to approximately 50 amps or more.

9. The power signal generator of claim 7, wherein the power output voltage signal has a selectable output rms magnitude range between substantially zero volts to approximately 600 volts or more.

10. The power signal generator of claim 2, wherein the waveform generation circuit further comprises a reference signal generator configured to output arbitrary signals, with harmonics up to or exceeding approximately the 50th order of 60 Hz or 50 Hz fundamentals, the arbitrary analog waveform single-ended reference signal being output from the reference signal generator.

11. The power signal generator of claim 4, wherein the isolated power electronics unit is configured to separately supply isolated power to the differential power output driver.

12. The power signal generator of claim 11, wherein the waveform generation circuit further comprises a plurality of differential power output drivers configured to be connected to increase total power imparted to the impedance load.

13. The power signal generator of claim 1, wherein the differential input/output amplifier is configured as a switching amplifier.

14. The power signal generator of claim 13, wherein the differential power output driver includes an H-bridge to provide greater power efficiency and decreased size of the power signal generator.

15. The power signal generator of claim 1, wherein the differential power output driver comprises a differential filter to produce the non-inverted power signal and the inverted power signal.

16. The power signal generator of claim 14, wherein the differential power output driver comprises a differential low-pass filter to produce the non-inverted power signal and the inverted power signal.

17. The power signal generator of claim 6, wherein the waveform generation circuit further comprises a differential feedback unit configured to apply the non-inverted power signal to the first terminal of the impedance load, to apply the inverted power signal to the second terminal of the impedance load, to output the non-inverted feedback signal to the second summation unit, and to output the inverted feedback signal to the first summation unit;
wherein the differential feedback unit comprises:
a differential generating unit configured to generate the non-inverted feedback signal and the inverted feedback signal in proportion to a selectable output rms magnitude of the power output current signal that flows through the impedance load, and
a differential current monitor amplifier pair configured to scale the non-inverted feedback signal and the inverted feedback signal.

18. The power signal generator of claim 17, wherein the differential generating unit comprises a non-inverted output current shunt and an inverted output current shunt.

19. The power signal generator of claim 13, wherein the differential input/output amplifier includes an H-bridge to provide greater power efficiency and decreased size of the power signal generator.

20. The power signal generator of claim 2, wherein the signal converter comprises a filtering and amplifying transfer unit to filter extraneous noise from and amplify the arbitrary analog waveform single-ended reference signal.

21. The power signal generator of claim 1, wherein an output signal produced between the first terminal and the second terminal of the impedance load is a dc quantity.

22. A power signal generator for verifying accuracy of power measurement equipment, the power measurement equipment being configured to measure an amount of power delivered from an electric utility company to an impedance load, the power signal generator comprising:
a waveform generation circuit, comprising:
a first summation unit configured to receive a non-inverted reference signal and an inverted feedback signal, and to output a non-inverted first summation signal;
a second summation unit configured to receive an inverted reference signal and a non-inverted feedback signal, and to output an inverted second summation signal;
a differential power output driver configured with a non-inverted input to receive the first summation signal, an inverted input to receive the second summation signal, a non-inverted output to output a non-inverted power signal to a first terminal of an impedance load, and an inverted output to output an inverted power signal to a second terminal of the impedance load; and
a differential feedback unit configured to produce the non-inverted and inverted feedback signals as differential output feedback signals in response to the respective non-inverted and inverted power signals;
an input signal isolation unit configured to isolate an input test signal from the waveform generation circuit; and
a power isolation unit configured to isolate a source of operational power of the waveform generation circuit from the waveform generation circuit;
wherein the non-inverted power signal is supplied to the second summation unit as the non-inverted feedback signal, the non-inverted feedback signal being a proportional representation of the non-inverted power signal,
wherein the inverted power signal is supplied to the first summation unit as the inverted feedback signal, the inverted feedback signal being a proportional representation of the inverted power signal, and
wherein the differential feedback unit is configured to associate the non-inverted and inverted power signals with one or more parameters responsive to power in the impedance load.

23. The power signal generator of claim 22, wherein the differential power output driver is configured as a differential input/output amplifier and driver to amplify the received first and second summation signals.

24. The power signal generator of claim 22, wherein the waveform generation circuit further comprises a differential input/output amplifier configured to be in electrical communication with the first and second summation units and the differential power output driver to amplify the first and second summation signals before they are received at the differential power output driver.

25. The power signal generator of claim 22, wherein the one or more parameters include temperature of the impedance load, current through the impedance load, voltage across the impedance load, color of the impedance load, size of the impedance load, or any combination thereof.

26. The power signal generator of claim 22, wherein the non-inverted reference signal and the inverted reference signal are a reference differential signal pair.

27. The power signal generator of claim 26, wherein the waveform generation circuit further comprises a signal converter to convert an arbitrary analog waveform single-ended reference signal into the reference differential signal pair.

28. The power signal generator of claim 22, wherein the first and second summation units are configured as weighted summation units with scaling coefficients to control a magnitude of the respective inverted and non-inverted feedback signals according to the respective non-inverted and inverted reference signals.

29. A method of generating a power signal for verifying accuracy of power measurement equipment, the power measurement equipment being configured to measure an amount of power delivered from an electric utility company to an impedance load, the method comprising:
providing a waveform generation circuit for:

summing, with a first summation unit, a non-inverted reference signal and an inverted feedback signal, and outputting a non-inverted first summation signal;

summing, with a second summation unit, an inverted reference signal and a non-inverted feedback signal, and outputting an inverted second summation signal;

receiving the first summation signal at a non-inverted input of a differential power output driver, and the second summation signal at an inverted input of the differential power output driver;

outputting a non-inverted power signal to a first terminal of an impedance load from a non-inverted output of the differential power output driver, and outputting an inverted power signal to a second terminal of the impedance load from an inverted output of the differential power output driver;

producing, by a differential feedback unit, the non-inverted and inverted feedback signals as differential output feedback signals in response to the respective non-inverted and inverted power signals;

supplying the non-inverted power signal to the second summation unit as the non-inverted feedback signal, the non-inverted feedback signal being a proportional representation of the non-inverted power signal; and supplying the inverted power signal to the first summation unit as the inverted feedback signal, the inverted feedback signal being a proportional representation of the inverted power signal;

isolating, with an input isolation unit, an input test signal from the waveform generation circuit; and isolating, with a power isolation unit, a source of operational power of the waveform generation circuit from the waveform generation circuit;

wherein the differential feedback unit is configured to associate the non-inverted and inverted power signals with one or more parameters responsive to power in the impedance load.

30. The method of claim 29, wherein the differential power output driver is configured as a differential input/output amplifier and driver to amplify the received first and second summation signals.

31. The method of claim 29, further comprising amplifying the first and second summation signals by a differential input/output amplifier in electrical communication with the first and second summation units and the differential power output driver before the first and second summation signals are received at the differential power output driver.

32. The method of claim 29, wherein the one or more parameters include temperature of the impedance load, current through the impedance load, voltage across the impedance load, color of the impedance load, size of the impedance load, or any combination thereof.

33. The method of claim 29, wherein the non-inverted reference signal and the inverted reference signal are a reference differential signal pair.

34. The method of claim 33, further comprising converting, by a signal converter of the waveform generation circuit, an arbitrary analog waveform single-ended reference signal into the reference differential signal pair.

35. The method of claim 29, wherein the first and second summation units are configured as weighted summation units with scaling coefficients to control a magnitude of the respective inverted and non-inverted feedback signals according to the respective non-inverted and inverted reference signals.

* * * * *